US008989901B2

(12) United States Patent
Minami et al.

(10) Patent No.: US 8,989,901 B2
(45) Date of Patent: Mar. 24, 2015

(54) TRANSFER SYSTEM

(71) Applicant: Kabushiki Kaisha Yaskawa Denki, Fukuoka (JP)

(72) Inventors: Takashi Minami, Fukuoka (JP); Shinichi Katsuda, Fukuoka (JP)

(73) Assignee: Kabushiki Kaisha Yaskawa Denki, Kitakyushu-Shi, Fukuoka (JP)

( * ) Notice: Subject to any disclaimer, the term of this patent is extended or adjusted under 35 U.S.C. 154(b) by 63 days.

(21) Appl. No.: 13/765,754

(22) Filed: Feb. 13, 2013

(65) Prior Publication Data

US 2013/0218337 A1    Aug. 22, 2013

(30) Foreign Application Priority Data

Feb. 16, 2012    (JP) .................................. 2012-031982

(51) Int. Cl.
*G05B 7/00* (2006.01)
*B25J 9/00* (2006.01)
*B25J 9/16* (2006.01)
(Continued)

(52) U.S. Cl.
CPC .............. *B25J 9/0084* (2013.01); *B25J 9/1682* (2013.01); *H01L 21/67766* (2013.01); *H01L 21/681* (2013.01); *Y10S 414/137* (2013.01)
USPC ........... 700/248; 700/218; 700/245; 414/213; 414/937; 206/710

(58) Field of Classification Search
CPC ............ H01L 21/681; H01L 21/67265; H01L 21/67259; B23Q 17/24; B23Q 3/186
USPC .................. 700/218, 245, 248; 414/213, 937; 206/710
See application file for complete search history.

(56) References Cited

U.S. PATENT DOCUMENTS 8,258,426 B2 *   9/2012   Zhang et al. ............. 219/121.67
8,489,237 B2 *   7/2013   Gage et al. .................... 700/248
(Continued)

FOREIGN PATENT DOCUMENTS

| CN | 1876529 A | 12/2006 |
| JP | H10-173022 A | 6/1998 |
| JP | 2003-142417 A | 5/2003 |

(Continued)

OTHER PUBLICATIONS

Japanese Office Action dated Jan. 7, 2014 issued in corresponding Japanese application No. 2012-031982 and the English translation thereof.

(Continued)

*Primary Examiner* — McDieunel Marc
(74) *Attorney, Agent, or Firm* — Bacon & Thomas, PLLC

(57) ABSTRACT

A transfer system includes a substrate positioning device, robots having a first robot and a second robot; and robot control devices, the robot control devices including a first robot control device to which the first robot and the substrate positioning device are connected and a second robot control device to which the second robot is connected. The first robot control device includes an acquiring unit configured to acquire, from the substrate positioning device, at least an absolute deviation amount between the rotation center of the mounting table and a center position of the substrate positioned, and a transmitting unit configured to transmit correction information relying on the absolute deviation amount acquired by the acquiring unit, to the second robot control device to which the second robot is connected.

6 Claims, 6 Drawing Sheets

(51) Int. Cl.
*H01L 21/677* (2006.01)
*H01L 21/68* (2006.01)

(56) References Cited

U.S. PATENT DOCUMENTS

2010/0055901 A1* 3/2010 Zhang et al. .................. 438/669
2013/0178971 A1* 7/2013 Hashimoto et al. ........... 700/121

FOREIGN PATENT DOCUMENTS

JP 2003-168719 A 6/2003
JP 2011-249726 A 12/2011
KR 10-2008-0078426 A 8/2008

OTHER PUBLICATIONS

Korean Office Action dated Jan. 5, 2014 issued in corresponding Korean application No. 10-2013-0016250 and the English translation thereof.
Chinese Office Action dated Dec. 3, 2014 issued in corresponding Chinese application No. 201310051209.6 and the English translation thereof.

* cited by examiner

TRANSFER SYSTEM

CROSS-REFERENCE TO RELATED APPLICATION

The present disclosure contains subject matter related to that disclosed in Japanese Priority Patent Application No. 2012-031982 filed on Feb. 16, 2012. The contents of this application are incorporated herein by reference in their entirety.

BACKGROUND OF THE INVENTION

1. Field of the Invention

An embodiment disclosed herein relates to a transfer system.

2. Description of the Related Art

Conventionally, there are known a robot for transferring a thin work piece such as a semiconductor wafer or a liquid crystal panel, and an aligner device for aligning a thin work piece by detecting the orientation of the work piece. In the following description, the aligner device will be referred to as "substrate positioning device".

It is sometimes the case that a plurality of robots is installed within a locally cleansed transfer chamber in order to increase a throughput. It is often the case that only one substrate positioning device is arranged within the transfer chamber even if a plurality of robots is installed within the transfer chamber.

There has been proposed a technology that controls a plurality of robots through the use of a robot control device for managing a transfer chamber and controlling the operation of a robot (see, e.g., Japanese Patent Application Publication No. 2011-249726).

In the conventional transfer system stated above, a plurality of robots is controlled by a single robot control device. This poses a problem in that a heavy load is applied to the robot control device.

In the event that a robot and a substrate positioning device are additionally installed, it is necessary to change a control method of a robot control device. Therefore, every system configuration needs to be customized.

SUMMARY OF THE INVENTION

An embodiment disclosed herein provides a transfer system capable of easily coping with a change of a system configuration.

In accordance with one aspect of the present invention, there is provided a transfer system, including: a substrate positioning device including a mounting table rotatable about a rotation center, the substrate positioning device being configured to perform position alignment of a substrate placed on the mounting table; a plurality of robots configured to deliver the substrate to and from the substrate positioning device, the robots including a first robot and a second robot; and a plurality of robot control devices provided in a corresponding relationship with the robots and configured to control operations of the robots, the robot control devices including a first robot control device to which the first robot and the substrate positioning device are connected and a second robot control device to which the second robot is connected, wherein the first robot control device includes an acquiring unit configured to acquire, from the substrate positioning device, at least an absolute deviation amount between the rotation center of the mounting table and a center position of the substrate positioned, and a transmitting unit configured to transmit correction information relying on the absolute deviation amount acquired by the acquiring unit, to the second robot control device to which the second robot is connected.

In accordance with one embodiment, it is possible to easily cope with a change of a system configuration.

DESCRIPTION OF THE EMBODIMENTS

One embodiment of a transfer system disclosed herein will now be described in detail with reference to the accompanying drawings which form a part hereof. However, the present invention is not limited to the embodiment to be described below.

A transfer system for transferring a thin work piece such as a semiconductor wafer or the like through the use of a robot will be described below by way of example. The thin work piece will be referred to as "wafer". A robot hand of a robot for holding a wafer will be referred to as "hand".

Figure 1:
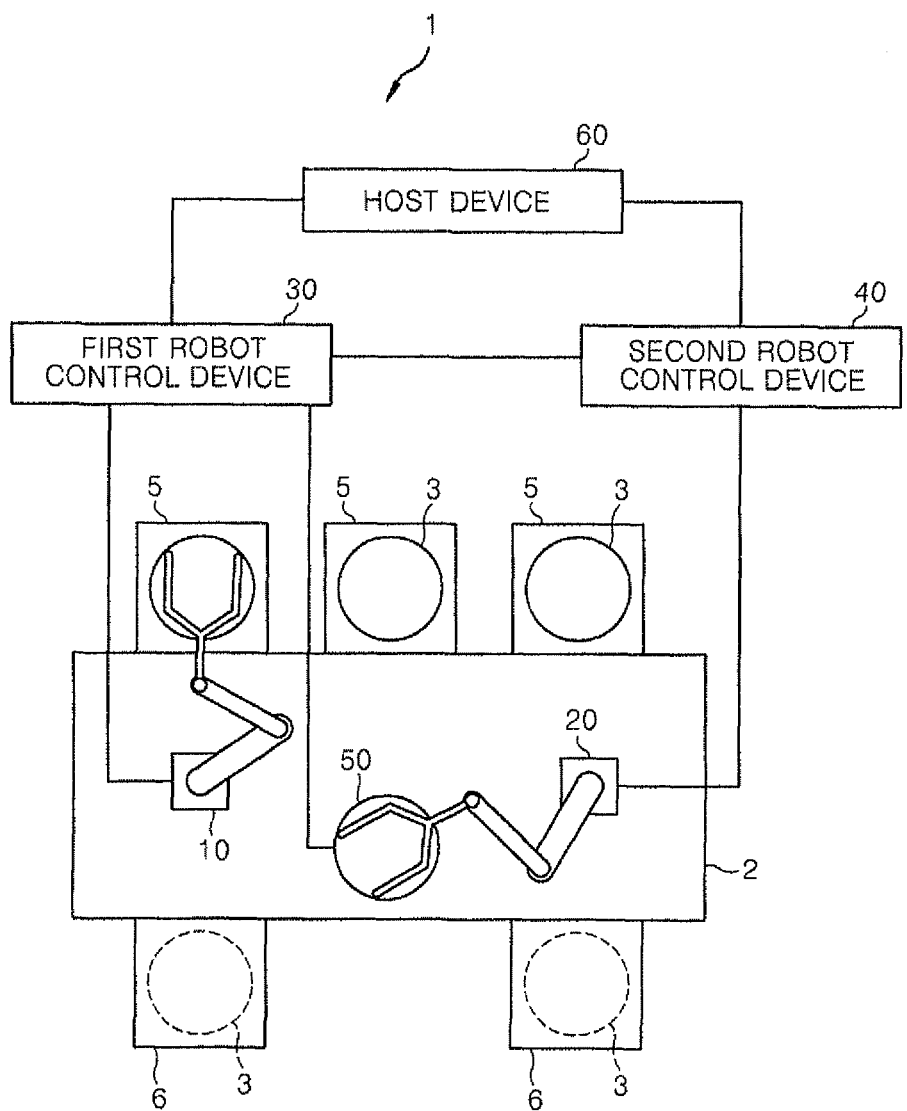
FIG. 1 is a schematic plan view showing a transfer system according to the present embodiment.

First, a transfer system 1 in accordance with the present embodiment will be described with reference to FIG. 1. FIG. 1 is a schematic plan view showing the transfer system 1 in accordance with the present embodiment.

In the transfer system 1 in accordance with the present embodiment, as shown in FIG. 1, first and second robot control devices 30 and 40 are respectively provided to first and second robots 10 and 20. The operations of the first and second robots 10 and 20 are respectively controlled by the first and second robot control devices 30 and 40. The first robot control device 30 also controls the operation of a substrate positioning device 50. The first robot control device 30 can receive information from the substrate positioning device 50 and can transmit the information to the second robot control device 40.

As shown in FIG. 1, the transfer system 1 in accordance with the present embodiment includes a host device 60, the first robot control device 30, the second robot control device 40, the first robot 10, the second robot 20, and the substrate positioning device 50.

The first robot control device 30 and the second robot control device 40 are connected to the host device 60 and can make communication with the host device 60. The first robot 10 and the substrate positioning device 50 are connected to the first robot control device 30 and can make communication with the first robot control device 30. The second robot 20 is connected to the second robot control device 40 and can make communication with the second robot control device 40. The second robot control device 40 is connected to the first robot control device 30 and can make communication with the first robot control device 30.

The host device 60 is a device for performing the overall control and management of the transfer system 1. For example, the host device 60 instructs the first robot 10 through the first robot control device 30 to unload a wafer 3 placed on the substrate positioning device 50 and to transfer the wafer 3 to a processing chamber 6 installed side by side with a transfer chamber 2.

The first robot control device 30 is a controller for controlling the operation of the first robot 10. The second robot control device 40 is a controller for controlling the operation of the second robot 20. The first robot control device 30 also controls the operation of the substrate positioning device 50 for positioning the wafer 3.

The first robot 10 and the second robot 20 for transferring the wafer 3, and the substrate positioning device 50 are arranged in the transfer chamber 2. The transfer chamber 2 is a clean room called an EFEM (Equipment Front End Module).

A filter (not shown) for purifying a gas is provided above the transfer chamber 2. The inside of the transfer chamber 2 is locally cleansed by a downwardly-flowing clean gas stream purified by the filter. The first robot control device 30 and the second robot control device 40 may be arranged within the transfer chamber 2.

Pursuant to the transfer instructions issued from the robot control devices 30 and 40 connected to the respective robots 10 and 20, each of the robots 10 and 20 takes out the wafer 3 from a storage container 5 arranged side by side with the transfer chamber 2. Then, each of the robots 10 and 20 brings the wafer 3 onto the substrate positioning device 50 or transfers the wafer 3 to a target position.

The storage container 5 is a box-shaped container capable of storing a plurality of wafers 3 in multiple stages along a height direction. More specifically, the storage container 5 is a so-called FOUP (Front-Opening Unified Pod) prescribed by the SEMI (Semiconductor Equipment and Materials International) standards.

The substrate positioning device 50 arranged in the transfer chamber 2 includes a mounting table 51 (see FIG. 4) rotatable about a rotation center. When the wafer 3 is placed on the mounting table 51, the substrate positioning device 50 performs a task of positioning the wafer 3. The substrate positioning device 50 detects a center position of the wafer 3 thus positioned and transmits the detected center position to the first robot control device 30. Details of the substrate positioning device 50 will be described later with reference to FIG. 4.

In the meantime, the first robot control device 30 calculates correction information pursuant to the absolute deviation amount between the center position of the positioned wafer 3 received from the substrate positioning device 50 and the rotation center of the mounting table 51. The first robot control device 30 corrects the unloading position of the wafer 3 pursuant to the correction information thus calculated.

When the wafer 3 placed on the substrate positioning device 50 is unloaded by the first robot 10, the first robot control device 30 causes the first robot 10 to move to the corrected unloading position of the wafer 3.

On the other hand, when the wafer 3 placed on the substrate positioning device 50 is unloaded by the second robot 20, the transfer system 1 causes the second robot 20 to move to the corrected unloading position of the wafer 3 in the following manner.

In this regard, the substrate positioning device 50 is connected to only the first robot control device 30. For that reason, the relative position of the second robot 20 with respect to the first robot 10 is pre-stored in the first robot control device 30.

Then, the first robot control device 30 calculates correction information pursuant to the absolute deviation amount between the center position of the positioned wafer 3 received from the substrate positioning device 50 and the rotation center of the mounting table 51.

Subsequently, the first robot control device 30 corrects the unloading position of the wafer 3 with respect to the second robot 20 pursuant to the aforementioned relative position and the calculated correction information. The first robot control device 30 transmits the corrected unloading position to the second robot control device 40. Meanwhile, the second robot control device 40 causes the second robot 20 to move to the corrected unloading position of the wafer 3.

Accordingly, even if the second robot control device 40 is not connected to the substrate positioning device 50, the second robot control device 40 can cause the second robot 20 to move to an accurate position defined by reflecting the deviation amount between the center position of the positioned wafer 3 and the rotation center of the mounting table 51.

In the transfer system of the present embodiment described above, the robot control devices are provided to the respective robots to control the operations of the robots connected thereto. The first robot control device, to which the first robot and the substrate positioning device are connected, acquires the absolute deviation amount between the rotation center and the center position of the positioned substrate from the substrate positioning device. Then, the first robot control device corrects the unloading position of the wafer 3 with respect to the second robot pursuant to the correction information relying on the aforementioned relative position and the acquired absolute deviation amount. The first robot control device transmits the corrected unloading position to the second robot control device to which the second robot is connected. The second robot control device causes the second robot to move to the corrected unloading position of the wafer 3.

Accordingly, the transfer system in accordance with the present embodiment can reduce the loads applied to the respective robot control devices, by distributing the loads applied to the respective robot control devices. In the transfer system in accordance with the present embodiment, even if a robot and a substrate positioning device are additionally installed, there is no need to customize every system configuration. It is therefore possible to easily cope with a change of a system configuration.

While two robots share one substrate positioning device with each other in the present embodiment, the present invention is not limited thereto. For example, it may be possible to employ a configuration in which three or more robots share one substrate positioning device with one another.

Figure 2:
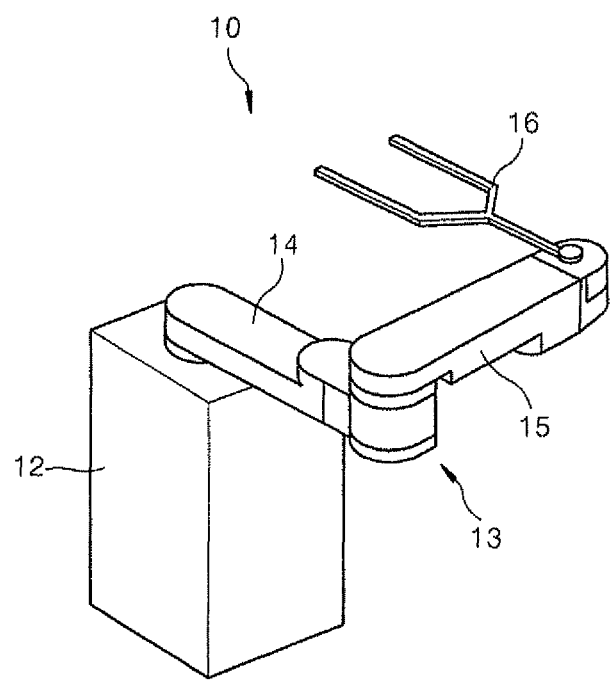
FIG. 2 is a schematic perspective view showing a robot according to the present embodiment.

Next, the first robot 10 in accordance with the present embodiment will be described in detail with respect to FIG. 2. FIG. 2 is a schematic perspective view showing the first robot 10 in accordance with the present embodiment. In FIG. 2, for the sake of easier description, the first robot 10 is shown in a partially simplified shape. The second robot 20 has the same configuration as that of the first robot 10. Therefore, no description will be made on the second robot 20.

As shown in FIG. 2, the first robot 10 is a horizontal articulated robot including two arms horizontally swinging about respective vertical axes. More specifically, the first robot 10 includes a body unit 12 and an arm unit 13.

The arm unit 13 includes a first arm 14, a second arm 15, and a hand 16 capable of holding a wafer 3 as a target object to be transferred. The arm unit 13 is horizontally rotatably supported on the upper portion of the body unit 12 provided with a lift mechanism.

More specifically, the base end portion of the first arm 14 is rotatably connected to the upper portion of the body unit 12.

The base end portion of the second arm 15 is rotatably connected to the upper portion of the tip end portion of the first arm 14. The hand 16 is rotatably connected to the tip end portion of the second arm 15.

The first arm 14, the second arm 15 and the hand 16 are rotatable with respect to one another and are rotated by a mechanism including a motor and a speed reducer. The mechanism including the motor and the speed reducer may be provided in the body unit 12 or may be arranged within the arm unit 13.

The first robot 10 causes the hand 16 to move to a target position by rotating the first arm 14, the second arm 15, and the hand 16. The first robot 10 can cause the hand 16 to move linearly by synchronously operating the first arm 14 and the second arm 15.

The lift mechanism provided in the body unit 12 includes a linear motion guide, a ball screw, and a motor. The lift mechanism causes the arm unit 13 to move up and down along the vertical direction by converting a rotating motion of the motor to a linear motion. The lift mechanism may cause the arm unit 13 to move up and down using a belt extending in the vertical direction.

With this configuration, the first robot 10 can unload the wafer 3 from the substrate positioning device 50 and can transfer the wafer 3 while vertically moving and rotating the arm unit 13. The first robot 10 can transport the wafer 3 to the processing chamber 6 or can transfer the wafer 3 to a target position.

The processing chamber 6 is a chamber installed side by side with the transfer chamber 2. An apparatus for subjecting the wafer 3 to specified processing such as CVD (Chemical Vapor Deposition), exposing, etching or asking is arranged within the processing chamber 6.

While the first robot 10 having one arm unit 13 has been described above, it may be possible to employ a dual-arm robot including two arm units 13 or a robot including three or more arm units 13. In case of the dual-arm robot, it is possible to simultaneously perform two tasks, e.g., to take out the wafer 3 from a specified transfer position with one of the arm units 13 while loading a new wafer 3 into the transfer position with the other arm unit 13.

The first robot 10 may have a configuration in which two or more hands 16 are arranged in the second arm 15. In this case, the hands 16 are installed on one shaft to rotate with respect to each other.

Figure 3:
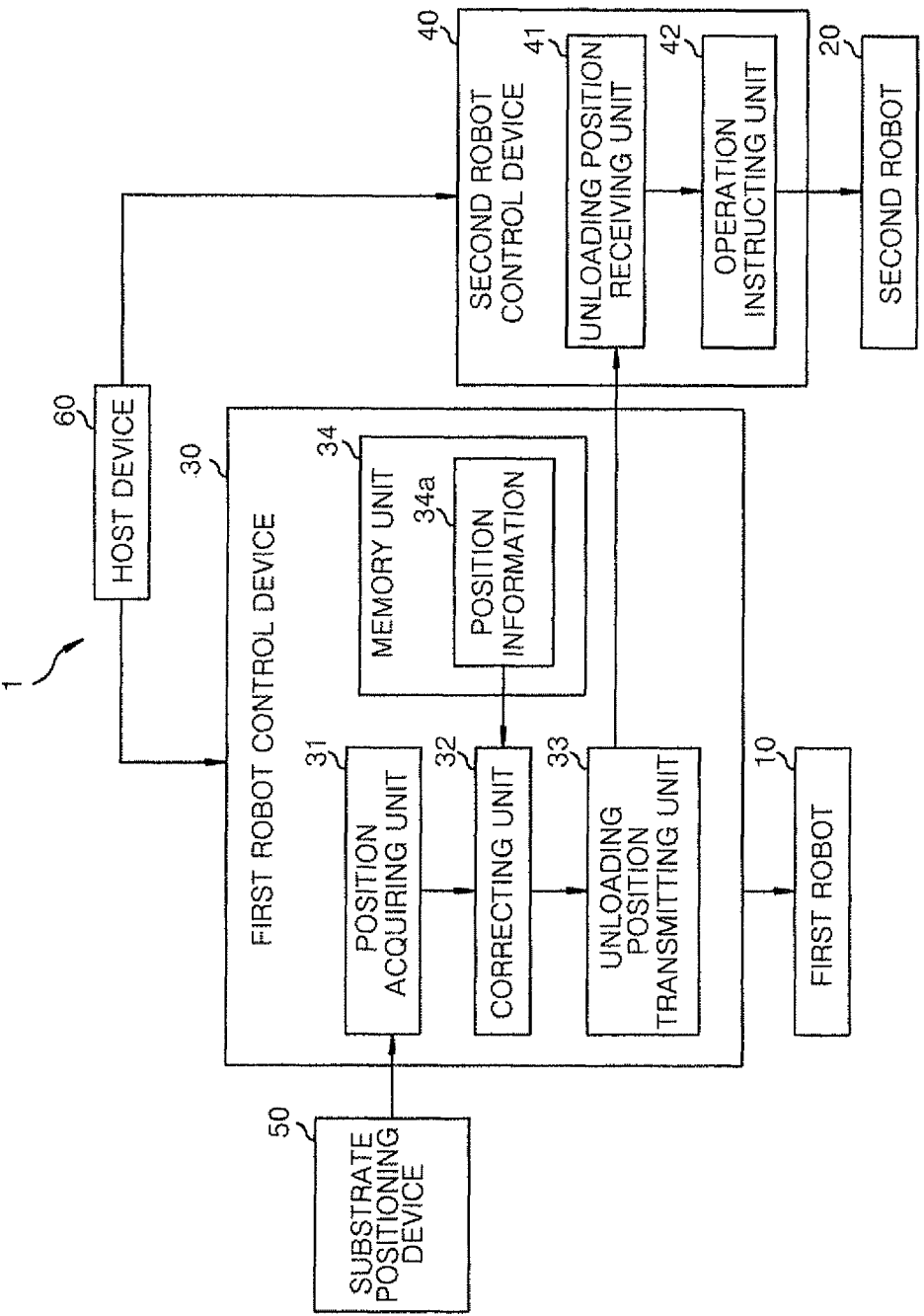
FIG. 3 is a block diagram of the transfer system according to the present embodiment.

Next, the configuration of the transfer system 1 in accordance with the present embodiment will be described with reference to FIG. 3. FIG. 3 is a block diagram showing the transfer system 1 in accordance with the present embodiment.

As shown in FIG. 3, the transfer system 1 includes the host device 60, the first robot control device 30, the second robot control device 40, the first robot 10, the second robot 20, and the substrate positioning device 50. The host device 60 is a device for performing the overall control and management of the transfer system 1.

Figure 4:
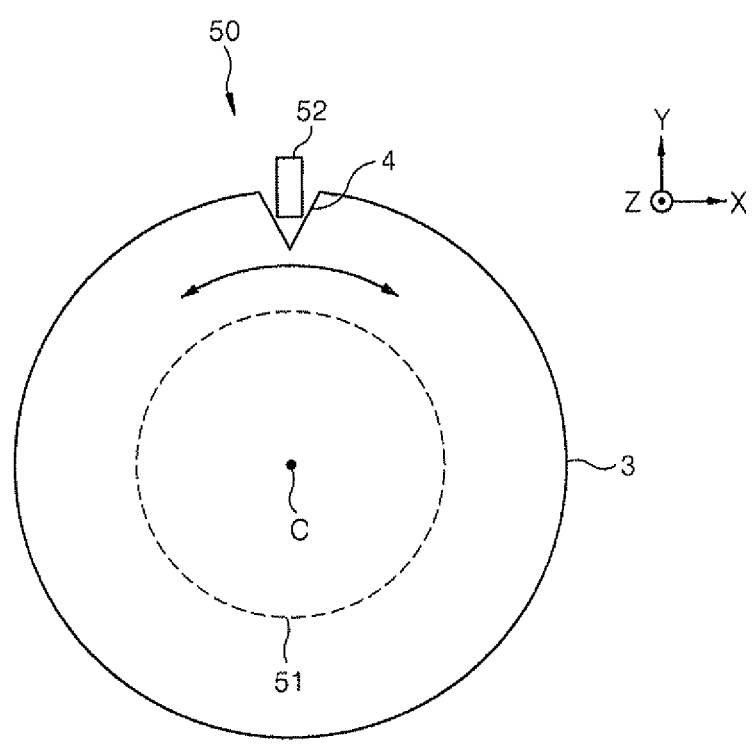
FIG. 4 is a schematic plan view showing a substrate positioning device.

The substrate positioning device 50 performs the positioning of the wafer 3 when the wafer 3 is placed on the substrate positioning device 50. The positioning of the wafer 3 performed by the substrate positioning device 50 will now be described with reference to FIG. 4. FIG. 4 is a schematic plan view showing the substrate positioning device 50. In FIG. 4, for the sake of easier description, the substrate positioning device 50 is shown in a partially simplified shape. The following description will be made by appropriately using a coordinate system illustrated in the right upper region in FIG. 4.

As shown in FIG. 4, the substrate positioning device 50 includes the mounting table 51 and a sensor unit 52. The mounting table 51 can rotate about a rotation center C together with the wafer 3 placed on the mounting table 51 (see the arrow shown in FIG. 4). The mounting table 51 is rotated by a mechanism including a motor, a speed reducer and so forth.

While not shown in FIG. 4, the substrate positioning device 50 may include an attraction unit for attracting the wafer 3 toward the mounting table 51. The attraction unit holds the wafer 3 with a specified holding force (i.e., an attracting force) and prevents misalignment of the wafer 3 caused by a centrifugal force, thereby increasing the positioning accuracy. The substrate positioning device 50 may be a so-called edge grip type that rotates the wafer 3 by gripping the peripheral edge of the wafer 3.

The sensor unit 52 is a detector unit for detecting, e.g., a cutout (hereinafter referred to as "notch 4") formed in the peripheral edge of the wafer 3. In the present embodiment, the sensor unit 52 formed of an optical sensor will be described by way of example.

The sensor unit 52 includes a light emitter (not shown) and a light receiver (not shown). The light emitter and the light receiver are arranged in an opposing relationship along a Z-axis direction with a gap for passage of the peripheral edge of the wafer 3 left between the light emitter and the light receiver. The light emitted from the light emitter is received by the light receiver.

The sensor unit 52 detects the notch 4 pursuant to a change in the amount of the light received by the light receiver when the wafer 3 makes rotation while cutting off the light emitted from the light emitter. While the use of an optical sensor is described herein, it may be possible to take an image of the wafer 3 and detect the notch 4 using the image thus taken.

When unloading and transferring the wafer 3 from the substrate positioning device 50 and transporting the wafer 3 to a specified processing chamber 6, there is a need to align the respective crystal axis direction of the wafers 3. For that reason, it is necessary for the substrate positioning device 50 to have the notch 4 of the wafer 3 oriented in a specified direction with respect to the robot 10 or 20 unloading the wafer 3.

If the notch 4 is detected by the sensor unit 52, the substrate positioning device 50 causes the detected notch 4 placed on the mounting table 51 to move to an optimal position with respect to the robots 10 or 20 unloading the wafer 3. This operation will be hereinafter referred to as "notch position alignment".

The substrate positioning device 50 detects the center position of the wafer 3 gone through the notch position alignment and transmits the detected center position of the wafer 3 to the first robot control device 30. The method of detecting the center position of the wafer 3 is well known in the art (see, e.g. Japanese Patent No. 4400341) and the description thereof will be omitted herein. In the manner stated above, the substrate positioning device 50 performs the positioning of the wafer 3.

Referring back to FIG. 3, the first robot control device 30 includes a position acquiring unit 31, a correcting unit 32, an unloading position transmitting unit 33, and a memory unit 34. The first robot control device 30 controls the operations of the first robot 10 and the substrate positioning device 50 for positioning the wafer 3.

The memory unit 34 is formed of a memory device such as a RAM (Random Access Memory) or a nonvolatile memory. The memory unit 34 stores position information 34a.

The position information 34a is the information indicating the relative position of the second robot 20 with respect to the first robot 10. For example, the distance and angle between the first robot 10 and the second robot 20 is used as the position information 34a.

The position acquiring unit 31 performs a process of receiving from the substrate positioning device 50 the center position of the wafer 3 gone through the notch position alignment and delivering the center position of the wafer 3 to the correcting unit 32.

The correcting unit 32 calculates correction information pursuant to the absolute deviation amount between the center position of the wafer 3 received from the position acquiring unit 31 and the rotation center C of the mounting table 51. When the wafer 3 placed on the substrate positioning device 50 is unloaded by the first robot 10, the correcting unit 32 corrects the unloading position of the wafer 3 with respect to the first robot 10 based on the calculated correction information. Thereafter, the first robot control device 30 operates the first robot 10 pursuant to the corrected unloading position of the wafer 3 to unload the wafer 3 placed on the substrate positioning device 50.

Figure 5:
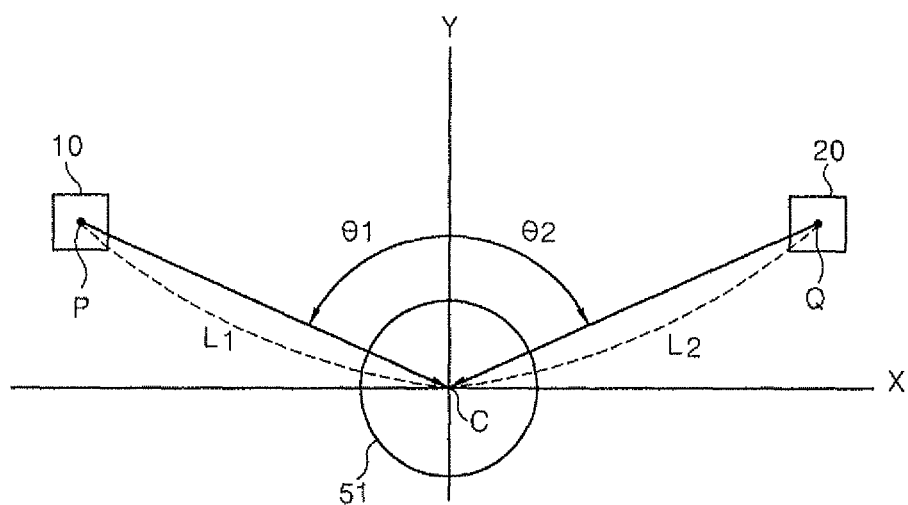
FIG. 5 is a view illustrating a teaching position.
Figure 6:
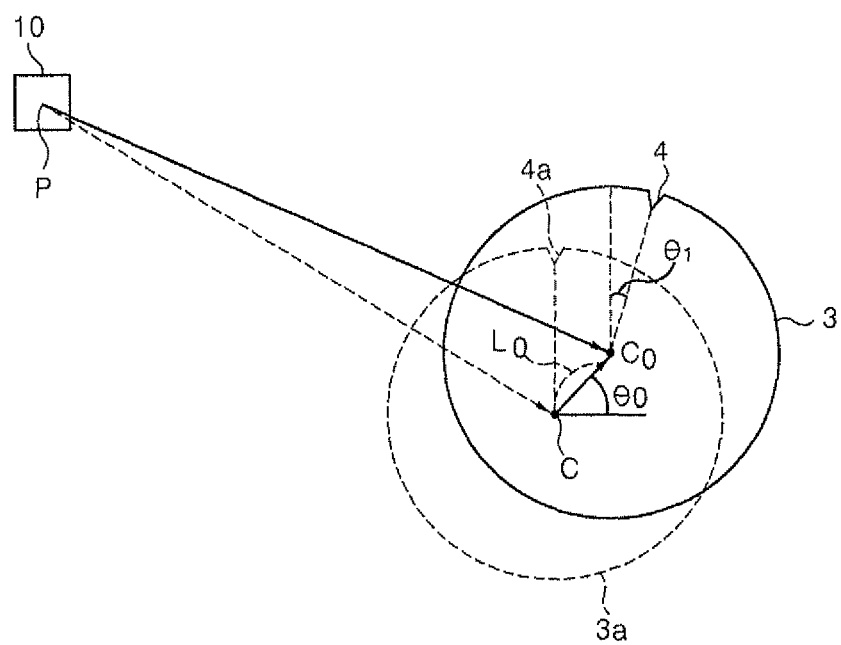
FIG. 6 is a view illustrating a deviation amount of a center position.

The deviation amount of the center position of the wafer 3 will now be described with reference to FIGS. 5 and 6. FIG. 5 is a view illustrating a teaching position. FIG. 6 is a view illustrating the deviation amount of the center position.

In the transfer system 1, teaching data taught in advance are stored in the respective robot control devices 30 and 40 for controlling the robots 10 and 20. Information indicating a target transfer position of the wafer 3 is contained in the teaching data as a teaching position. For example, the teaching data contain a teaching position pointed from the first robot 10 to the storage container 5 and a teaching position pointed from the second robot 20 to the processing chamber 6.

The teaching data stored in the first robot control device 30 contains a teaching position pointed from the first robot 10 to the substrate positioning device 50.

More specifically, as shown in FIG. 5, the teaching position is a direction extending from a specified reference point P of the first robot 10 toward the rotation center C of the mounting table 51 and is a vector PC defined by a distance L1 and an angle $\theta 1$. In this regard, the rotation center C of the mounting table 51 is the origin of an XY coordinate. The angle $\theta 1$ is an angle measured from the positive-side Y-axis.

The teaching data stored in the second robot control device 40 contains a teaching position from the second robot 20 to the substrate positioning device 50. As shown in FIG. 5, the teaching position is a direction extending from a specified reference point Q of the second robot 20 toward the rotation center C of the mounting table 51 and is a vector QC defined by a distance L2 and an angle $\theta 2$.

If the center of the wafer 3 placed on the substrate positioning device 50 is aligned with the rotation center C of the mounting table 51, the respective robot control devices 30 and 40 operate the robots 10 and 20 pursuant to the teaching positions stored in the respective robot control devices 30 and 40.

In the event that the center $C_0$ of the wafer 3 is deviated from the rotation center C of the mounting table 51 as shown in FIG. 6, a deviation is generated between the center $C_0$ of the wafer 3 and the rotation center C of the mounting table 51 even if the notch position alignment is finished by the substrate positioning device 50. The wafer 3a indicated by a broken line is a wafer placed in the teaching position.

The correction information relying on the deviation amount between the rotation center C of the mounting table and the center $C_0$ of the wafer 3 actually placed is a vector $CC_0$ defined by a distance $L_0$ and an angle $\theta_0$. Pursuant to this correction information $L_0$ and $\theta_0$, the correcting unit 32 corrects the teaching position (the vector PC) with respect to the first robot 10 and calculates the unloading position (the vector $PC_0$).

Thereafter, the first robot control device 30 causes the first robot 10 to move to the unloading position (the vector $PC_0$) corrected by the correcting unit 32, thereby unloading and transferring the wafer 3 placed on the substrate positioning device 50.

If the center $C_0$ of the wafer 3 is deviated from the center C of the teaching position, the final center position of the wafer 3 is changed depending on the direction of the notch 4 which has been subjected to the notch position alignment. More specifically, in case that the wafer 3a placed in the teaching position is positioned to have a deviation of $\theta_1$ from the notch 4a, the center position of the wafer 3 lies in the position $C_0$ deviated from the rotation center C by a distance $L_0$ and an angle $\theta_0$. Thus, the correcting unit 32 corrects the teaching position by reflecting the angle difference $\theta_1$.

Referring back to FIG. 3, when the wafer 3 placed on the substrate positioning device 50 is unloaded by the second robot 20, the correcting unit 32 corrects the unloading position of the wafer 3 with respect to the second robot 20 in the following manner.

As is the case in the first robot 10, the correcting unit 32 first calculates correction information $L_0$ and $\theta_0$ pursuant to the absolute deviation amount between the center position of the positioned wafer 3 received from the substrate positioning device 50 and the rotation center C of the mounting table 51.

Then, the correcting unit 32 corrects the unloading position (the vector QC) of the wafer 3 with respect to the second robot 20 pursuant to the calculated correction information $L_0$ and $\theta_0$ and the position information 34a and calculates an unloading position (a vector $QC_0$). The position information 34a indicates the relative position of the second robot 20 with respect to the first robot 10. The correcting unit 32 also performs a process of delivering the calculated unloading position (the vector $QC_0$) to the unloading position transmitting unit 33.

The unloading position transmitting unit 33 transmits the unloading position (the vector $QC_0$) with respect to the second robot 20, which is received from the correcting unit 32, to an unloading position receiving unit 41 of the second robot control device 40.

The second robot control device 40 includes the unloading position receiving unit 41 and an operation instructing unit 42, and controls the operation of the second robot 20. The unloading position receiving unit 41 receives the unloading position (the vector $QC_0$) with respect to the second robot 20 from the unloading position transmitting unit 33.

The operation instructing unit 42 operates the second robot 20 pursuant to the unloading position (the vector $QC_0$) with respect to the second robot 20, which is received by the unloading position receiving unit 41, and unloads the wafer 3 placed on the substrate positioning device 50.

In the present embodiment, the transfer position and the teaching position in operating the robots 10 and 20 with the robot control devices 30 and 40 have been described using the positions on the XY plane. In reality, however, the robots 10 and 20 are caused to move in the height direction (the Z-axis direction). The height direction movement of the robots 10 and 20 are well known in the art and the description thereof will be omitted herein.

Figure 7:
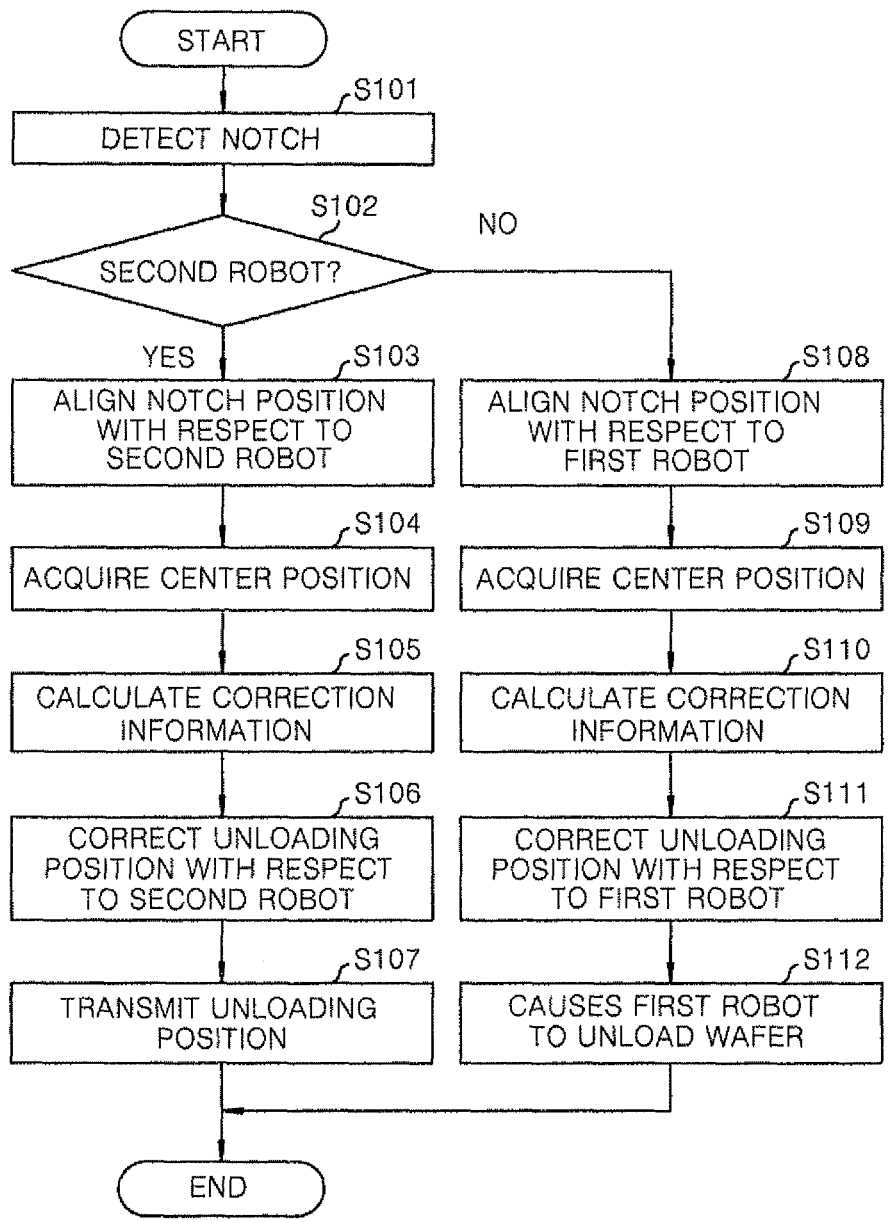
FIG. 7 is a flowchart illustrating a processing sequence of a correcting process.

Next, details of the correcting process performed by the first robot control device 30 will be described with reference to FIG. 7. FIG. 7 is a flowchart illustrating the processing sequence of the correcting process.

As shown in FIG. 7, the first robot control device 30 instructs the substrate positioning device 50 to detect the notch 4 (step S101). The first robot control device 30 determines whether the second robot 20 unloads the wafer 3 placed on the substrate positioning device 50 (step S102).

If the second robot 20 unloads the wafer 3 (if Yes in step S102), the first robot control device 30 instructs the substrate positioning device 50 to perform notch position alignment with respect to the second robot 20 (see step S103).

The position acquiring unit 31 acquires the center position $C_0$ of the wafer 3 gone through the notch position alignment from the substrate positioning device 50 (step S104). The correcting unit 32 calculates correction information $L_0$ and $\theta_0$ pursuant to the absolute deviation amount between the center position $C_0$ of the wafer 3 acquired by the position acquiring unit 31 and the rotation center C of the mounting table 51 (step S105).

Thereafter, the correcting unit 32 corrects the unloading position (the vector QC) of the wafer 3 with respect to the second robot 20 pursuant to the calculated correction information $L_0$ and $\theta_0$ and the position information 34a (step S106) and calculates an unloading position (a vector $QC_0$).

Then, the unloading position transmitting unit 33 transmits the unloading position (the vector $QC_0$) of the wafer 3 with respect to the second robot 20, which is corrected by the correcting unit 32, to the unloading position receiving unit 41 of the second robot control device 40 (step S107), whereby a series of processing comes to an end.

On the other hand, if the second robot 20 does not unload the wafer 3 (if No in step S102), the first robot control device 30 instructs the substrate positioning device 50 to perform notch position alignment with respect to the first robot 10 (step S108).

The position acquiring unit 31 acquires the center position $C_0$ of the wafer 3 gone through the notch position alignment from the substrate positioning device 50 (step S109). The correcting unit 32 calculates correction information $L_0$ and $\theta_0$ pursuant to the absolute deviation amount between the center position $C_0$ of the wafer 3 acquired by the position acquiring unit 31 and the rotation center C of the mounting table 51 (step S110).

Thereafter, the correcting unit 32 corrects the unloading position (the vector PC) of the wafer 3 with respect to the first robot 10 pursuant to the calculated correction information $L_0$ and $\theta_0$ (step S111) and calculates an unloading position (a vector $PC_0$).

Then, the first robot control device 30 instructs the first robot 10 to unload the wafer 3 based on the unloading position (the vector $PC_0$) corrected by the correcting unit 32. Thus, the first robot 10 unloads the wafer 3 placed on the substrate positioning device 50 (step S112). Thereafter, the first robot control device 30 terminates a series of processing.

While the detection of the notch 4, the notch position alignment, and the unloading of the wafer 3 are instructed by the first robot control device 30 in the present embodiment, these instructions may be performed by the host device 60.

In the transfer system 1 of the present embodiment, the first robot control device 30 is configured to correct the unloading position (the vector QC) of the wafer 3 with respect to the second robot 20. However, the present invention is not limited thereto. For example, the first robot control device 30 may transmit the calculated correction information $L_0$ and $\theta_0$ to the second robot control device 40.

The second robot control device 40 may correct the unloading position (the vector $QC_0$) of the wafer 3 with respect to the second robot 20 pursuant to the correction information $L_0$ and $\theta_0$ received from the first robot control device 30. Accordingly, it is not necessary for the first robot control device 30 to store the position information 34a indicating the relative position of the second robot 20 with respect to the first robot 10.

In the transfer system of the present embodiment described above, the robot control devices are provided to the respective robots and the operations of the robots are controlled by the respective robot control devices. One of the robot control devices also controls the operation of the substrate positioning device.

With the configuration described above, the transfer system in accordance with the present embodiment can reduce the loads applied to the respective robot control devices, by distributing the loads applied to the respective robot control devices. In the transfer system in accordance with the present embodiment, even if a robot and a substrate positioning device are additionally installed, there is no need to customize every system configuration. It is therefore possible to easily cope with a change of a system configuration.

Other effects and other modified examples can be readily derived by those skilled in the art. For that reason, the broad aspect of the present disclosure is not limited to the specific disclosure and the representative embodiment shown and described above. Accordingly, the present disclosure can be modified in many different forms without departing from the spirit and scope defined by the appended claims and the equivalents thereof.

What is claimed is:

1. A transfer system, comprising:
   a substrate positioning device including a mounting table rotatable about a rotation center, the substrate positioning device being configured to perform position alignment of a substrate placed on the mounting table;
   a plurality of robots configured to deliver the substrate to and from the substrate positioning device, the robots including a first robot and a second robot; and
   a plurality of robot control devices provided in a corresponding relationship with the robots and configured to control operations of the robots, the robot control devices including a first robot control device to which the first robot and the substrate positioning device are connected and a second robot control device to which the second robot is connected and the substrate positioning device is not connected,
   wherein the first robot control device includes an acquiring unit configured to acquire, from the substrate positioning device, at least an absolute deviation amount between the rotation center of the mounting table and a center position of the substrate positioned, and a transmitting unit configured to transmit correction information relying on the absolute deviation amount acquired by the acquiring unit, to the second robot control device to which the second robot is connected, and
   wherein the second robot control device includes an operation instructing unit configured to correct, pursuant to the correction information received from the first robot control device, teaching data required when the second robot moves toward the substrate positioning device and to operate the second robot pursuant to the corrected teaching data.

2. The system of claim 1, wherein the first robot control device further includes a correcting unit configured to correct the absolute deviation amount acquired by the acquiring unit to a relative deviation amount with respect to the second robot connected to the second robot control device, the transmitting unit being configured to transmit the relative deviation amount corrected by the correcting unit to the second robot control device as the correction information.

3. The system of claim 2, wherein the first robot control device further includes a memory unit configured to store position information on a relative position of the second robot with respect to the first robot, the correcting unit being configured to correct the absolute deviation amount to the relative deviation amount pursuant to the position information.

4. The system of claim 1, wherein the acquiring unit is configured to acquire, as the absolute deviation amount, a distance between the rotation center and the center position and an angle between a straight line interconnecting the rotation center and the center position and a specified reference axis.

5. The system of claim 1, wherein the teach data includes a distance between a specified reference point of the second robot and the rotation center and an angle between a straight line interconnecting the reference point and the rotation center and a specified reference axis.

6. The system of claim 1, wherein the substrate positioning device is configured to detect a notch formed at a peripheral edge of the substrate placed on the mounting table and render the notch to move to a predetermined position to enable the first robot or the second robot to unload the substrate.

* * * * *